United States Patent
Kron

(10) Patent No.: US 10,998,992 B2
(45) Date of Patent: May 4, 2021

(54) METHOD AND DEVICE FOR IMPROVEMENT OF THE SOUND QUALITY OF AN AUDIO FILE

(71) Applicant: Kronoton GmbH, Reinbek (DE)

(72) Inventor: Gunnar Kron, Aumuehle (DE)

(73) Assignee: Kronoton GmbH, Reinbek (DE)

(\*) Notice: Subject to any disclaimer, the term of this patent is extended or adjusted under 35 U.S.C. 154(b) by 0 days.

(21) Appl. No.: 15/568,292

(22) PCT Filed: Apr. 18, 2016

(86) PCT No.: PCT/DE2016/000156
§ 371 (c)(1),
(2) Date: Oct. 20, 2017

(87) PCT Pub. No.: WO2016/169541
PCT Pub. Date: Oct. 27, 2016

(65) Prior Publication Data
US 2018/0145779 A1    May 24, 2018

(30) Foreign Application Priority Data
Apr. 21, 2015 (DE) .................... 10 2015 005 007.9

(51) Int. Cl.
*G06F 3/16* (2006.01)
*H04H 60/73* (2008.01)
(Continued)

(52) U.S. Cl.
CPC ............ *H04H 60/73* (2013.01); *G06F 3/165* (2013.01); *G06F 16/61* (2019.01); *G06F 16/686* (2019.01);
(Continued)

(58) Field of Classification Search
None
See application file for complete search history.

(56) References Cited

U.S. PATENT DOCUMENTS 9,965,685 B2    5/2018   Matsuoka et al.
2007/0064954 A1*  3/2007   Booth .................. H04R 5/04
                                                        381/58
(Continued)

FOREIGN PATENT DOCUMENTS

CN    104240738 A    12/2014
EP    2 613 573 A1    7/2013
(Continued)

OTHER PUBLICATIONS

Joao Martins, "Gracenote Unveils New Much-Improved Connected Music Metadata Databases", web article retrieved from https://www.audioxpress.com/news/gracenote-unveils-new-much-improved-connected-music-metadata-databases, Feb. 24, 2017, Audio Xpress, USA.

(Continued)

*Primary Examiner* — James K Mooney
(74) *Attorney, Agent, or Firm* — W&C IP

(57) ABSTRACT

A method and device for improving the sound quality of an audio file in an audio device by modifying an audio signal by means of at least one effect device. The method according to the invention includes the following method steps: a) associating the audio file with meta data; b) comparing the meta data to files in which settings of the effect device are stored; c) associating the meta data with a file from method step b), and d) loading the file from method step c) and activating the effect device, the effect device being set by means of values from the file in method step c).

13 Claims, 12 Drawing Sheets

Figure 1:
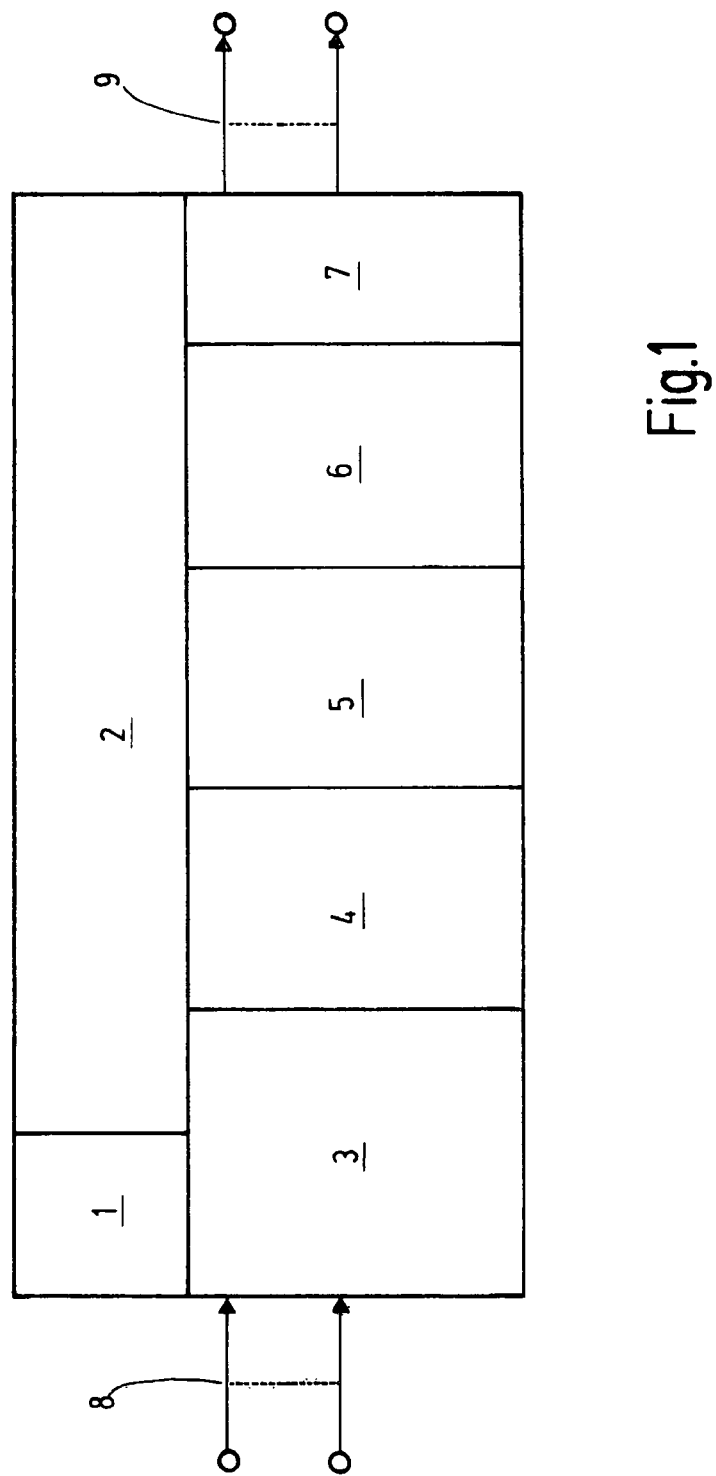

(51) Int. Cl.
*G06F 16/61* (2019.01)
*G06F 16/68* (2019.01)
*H04H 60/04* (2008.01)
*H03G 5/00* (2006.01)
*H03G 7/00* (2006.01)
*G10H 1/00* (2006.01)
*H04S 7/00* (2006.01)
*G11B 27/11* (2006.01)
*G11B 27/10* (2006.01)
*G10H 1/02* (2006.01)
*H04N 21/43* (2011.01)
*G06F 16/00* (2019.01)

(52) U.S. Cl.
CPC ............ *G10H 1/0091* (2013.01); *G10H 1/02* (2013.01); *G11B 27/105* (2013.01); *G11B 27/11* (2013.01); *H03G 5/005* (2013.01); *H03G 7/007* (2013.01); *H04H 60/04* (2013.01); *H04S 7/30* (2013.01); *G06F 16/00* (2019.01); *G10H 1/00* (2013.01); *G10H 2210/155* (2013.01); *G10H 2240/075* (2013.01); *G10H 2240/081* (2013.01); *H04N 21/43* (2013.01); *H04S 2400/13* (2013.01); *H04S 2420/03* (2013.01)

(56) References Cited

U.S. PATENT DOCUMENTS

| | | | |
|---|---|---|---|
| 2009/0047993 A1* | 2/2009 | Vasa | G11B 27/105 455/556.1 |
| 2009/0157753 A1 | 6/2009 | Lee et al. | |
| 2009/0290725 A1* | 11/2009 | Huang | H03G 5/165 381/103 |
| 2012/0143363 A1 | 6/2012 | Liu et al. | |
| 2013/0178964 A1* | 7/2013 | Bergmann | H04S 7/308 700/94 |
| 2013/0245798 A1* | 9/2013 | Kallai | H03G 5/165 700/94 |
| 2014/0241538 A1 | 8/2014 | Ayres | |
| 2015/0207481 A1* | 7/2015 | Duwenhorst | H03G 7/007 381/107 |
| 2016/0065159 A1 | 3/2016 | Yu | |

FOREIGN PATENT DOCUMENTS

WO  2009/093866 A2  7/2009
WO  2015/038522 A1  3/2015

OTHER PUBLICATIONS

Zotope, Inc. (Oct. 30, 2014). Dynamic EQ in Audio Mastering [Video]. YouTube. https://www.youtube.com/watch?v=Vsj3BQXjoEY.

* cited by examiner

METHOD AND DEVICE FOR IMPROVEMENT OF THE SOUND QUALITY OF AN AUDIO FILE

CROSS REFERENCE TO RELATED APPLICATIONS

This application is the National Stage of PCT/DE2016/000,156 filed on Apr. 18, 2016, which claims priority under 35 U.S.C. § 119 of German Application No. 10 2015 005 007.9 filed on Apr. 21, 2015, the disclosures of which are incorporated by reference. The international application under PCT article 21(2) was not published in English.

The invention relates to a method for improvement of the sound quality of an audio file in an audio device by modification of an audio signal by means of at least one effect device. Furthermore, the invention relates to a device for carrying out the method.

Methods of the type stated initially are known from the state of the art and are used to improve the sound of a device that plays audio. Effect devices such as equalizers, compressors, limiters, as well as reverb and echo devices are usually used for this purpose, individually or as a unit.

A compressor/limiter, for example, is a limiter that hinders a peak level from being exceeded in order to prevent overmodulation. They also have significance as volume/loudness regulators of instrument groups/singing or speech. Values of the parameters channel fader, threshold, attack (if present), release, and output level (output level) are set for this purpose.

Equalizers, for example, are used for correction, equalization or other exertion of influence on the sound pattern, and consist of multiple filters with which the entire tone frequency range of the audio signal can be processed. This happens, for example, by way of the specific setting of frequencies and of the filter quality.

Effect devices are therefore also connected with specific settings, in order to influence or improve the sound quality of audio signals, also of an audio file.

In this regard, in conventional methods the overall sound of the device that plays the audio is adapted, i.e. the selected settings of the effect devices are supposed to apply to all audio that is played by way of the audio device. For this purpose, the respective terminal, which can be adjusted by the consumer or user, is positioned in the main audio channel path of the device in question by the manufacturer of the audio device. In this regard, it is unimportant whether this is a device that plays audio and has one, two or more channels. In order to be able to offer the consumers or users of the audio device a broader wealth of facets of sound settings, conventional effect devices generally have pre-settings, called presets, i.e. in the case of a compressor/limiter, for example, values of the parameters such as channel fader, threshold, attack, release, and output level are already set. Some of these pre-settings (presets) are already pre-programmed, such as, for example, settings having the names "music," "movie" or "game," and are therefore supposed to stand for a specific sound pattern. Others can be freely created and stored in memory, and these are called user pre-settings (user presets). If the consumer or user wants to switch between different settings, he/she must select the effect device and manually change the setting. This is done either by way of activation of a stored pre-setting or manual creation of a new setting.

According to the present state of the art, however, it is not possible for consumers or users to implement an individual sound adaptation that is dependent on the audio event but fully automated, and thereby to use it. This results in the disadvantage that the settings found within an audio-playing device for all the audio events to be played will produce effective sounds for some audio events but less effective sounds or none for others. For example, an amplified bass frequency is excellently suited for some audio events, but not at all suited for others, which have a strongly produced bass right from the start. Also, speech amplification is excellently suited in a specific movie trailer, but not at all suited in a different piece of music that includes singing, since in this case, the singer sounds distorted and excessive, since the music piece was already produced with a high vocal level. Users therefore are forced to change the settings or pre-settings of the effect device more frequently and manually, in order to have the enjoyment of the most optimal listening event possible. For the consumer or user, this means that specific audio events sound better, and others sound worse. Also, the state of the art has a negative effect in that the consumer or user does not undertake settings of the effect devices that are available in the audio device right from the start.

It is therefore the task of the present invention to eliminate these disadvantages.

This task is accomplished with the characteristics of claim 1. Advantageous embodiments of the invention are evident from the dependent claims.

The method according to the invention is characterized by the following steps:
a) association of the audio file with meta data;
b) comparison of the meta data with files in which settings of the effect device are stored;
c) association of the meta data with a file from method step b), and
d) loading of the file from method step c) and activation of the effect device, wherein the effect device is set with values from the file in method step c).

It is the core idea of the invention to achieve individual sound adaptation for every audio file, if at all possible, in that an audio file is first ascertained and found using meta data, and then the audio signals of this audio file is provided with effectively set effect devices. Meta data are data that describe the content of media files, such as audio files and video files. They are used to describe the content of these files (e.g. composer, length, genre) or also to describe subsumption of different file formats into what are called container formats. Meta data are either changeable or unchangeable components of a media file or also of descriptions detached from media files, which are administered in meta databanks, for example. Even then, they are linked with specific media files, but are present externally and not within the media file itself. Within the scope of the method according to the invention, both media-file-internal (for example ID3 tag) and media-file-external (freely selectable meta data catalogs) can be used. Furthermore, the files that contain settings of the effect device can also be stored in the storage medium in which the audio files with which meta files are associated and/or can be associated are stored.

The method according to the invention solves the problem of individual sound adaptation, which did not exist until now. It is the advantage of the invention that it is now possible, for the first time, to actually provide individually played audio events with the effect devices that are optimally set for them, in each instance. The consumer or user himself/herself therefore no longer has to intervene, but rather is able to enjoy his/her audio events in a manner that is automatically optimized for the audio-playing device and/or the listening environment. By means of a distribution of automated and manually adjustable effect devices, it is furthermore possible to allow the consumer or user to have possibilities of intervening in the sound, so that he/she can further individualize it if necessary. The same holds true for persons skilled in the art, such as audio engineers, for example, who wish to adapt the method according to the invention to specific audio-playing devices or environments. In this regard, the method according to the invention becomes more and more precise, the more data, i.e. the more meta data, are available and can be evaluated with regard to the audio files to be played. It is advantageous that individual optimization of sound events of all epochs, genres, and styles can take place by means of the method according to the invention. For the first time, even audio events of different epochs, which are played one after the other in a mix, sound homogeneous, for example because lower sound qualities of older recordings, for example, can be individually adapted to contemporary sound by means of the method according to the invention.

An advantageous further development of the invention provides that the meta data are stored in the audio file. A practicable variant of the invention provides that the meta data are stored in an external database. The variant of the invention last mentioned has the advantage that it is possible to utilize large vendors of meta data and their repertoire of musical pieces.

It is practical if the files from method step b) are stored in a database of the audio device or in a Cloud. In this way, large inventories of files can be centrally stored, in advantageous manner, which files contain the set effect devices. The database can also be an external database, i.e. it can be situated outside of the audio device. Large inventories of files in turn have the advantage that further differentiation of set effect devices and therefore also of the audio files is undertaken.

A further advantageous embodiment of the invention provides that the audio signal modified by the effect device is passed on to audio outputs of the device. In this way, it is guaranteed that the audio device can be coupled with additional loudspeakers, and thereby the sound experience can be improved even further.

A device for carrying out the method is the object of claim 7, wherein it has:
- a storage medium in which the audio files are stored, with which meta files are associated and/or can be associated;
- at least one effect device;
- a further storage medium in which files are stored, which files contain settings of the effect device, and
- a control module that is associated with the storage medium, the effect device, and the further storage medium.

Preferably, the device has audio outputs and/or audio inputs. Also, it can additionally have video inputs and/or video outputs, as well as further control inputs and outputs for controlling external devices, such as light sources, for example.

A computer program that is implemented in a device according to one of claims 7 to 10 is the object of claim 13, wherein the computer program contains an algorithm that is processed by a processor of the device, wherein the algorithm processes the method according to one of claims 1 to 6. The computer program can also be present in the form of a media player, in this regard.

Figure 2:
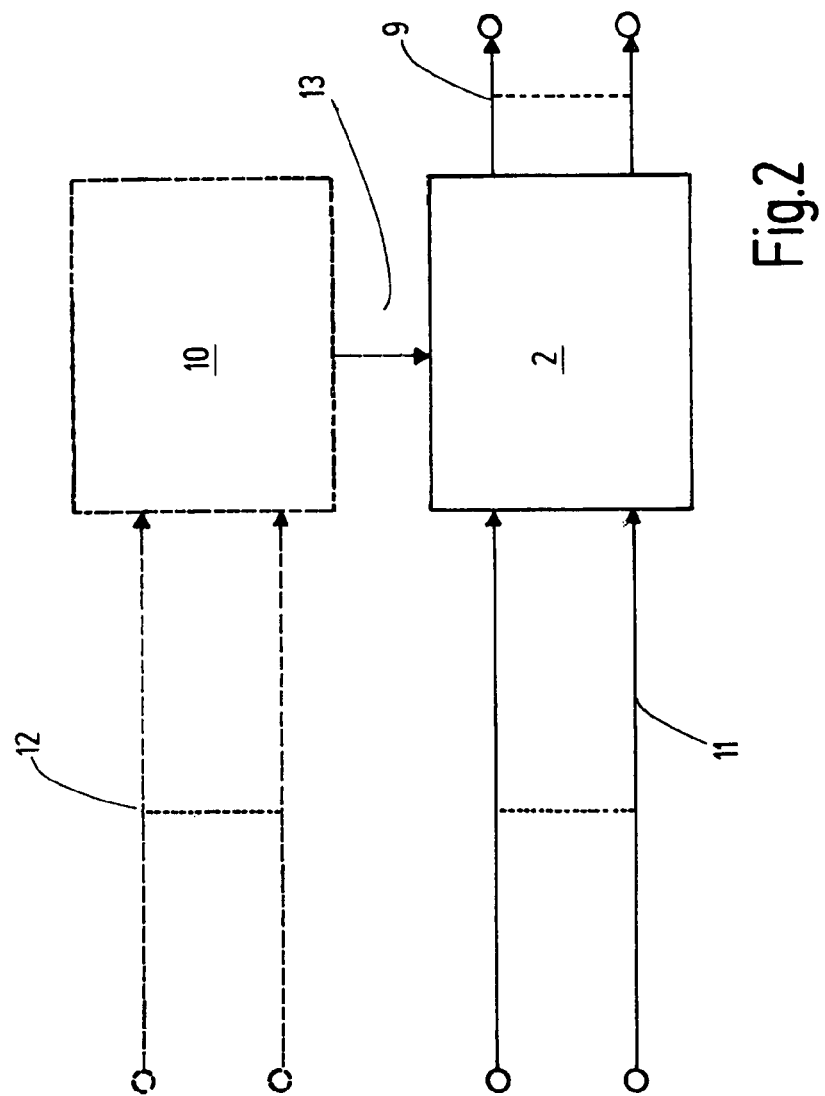
Figure 3:
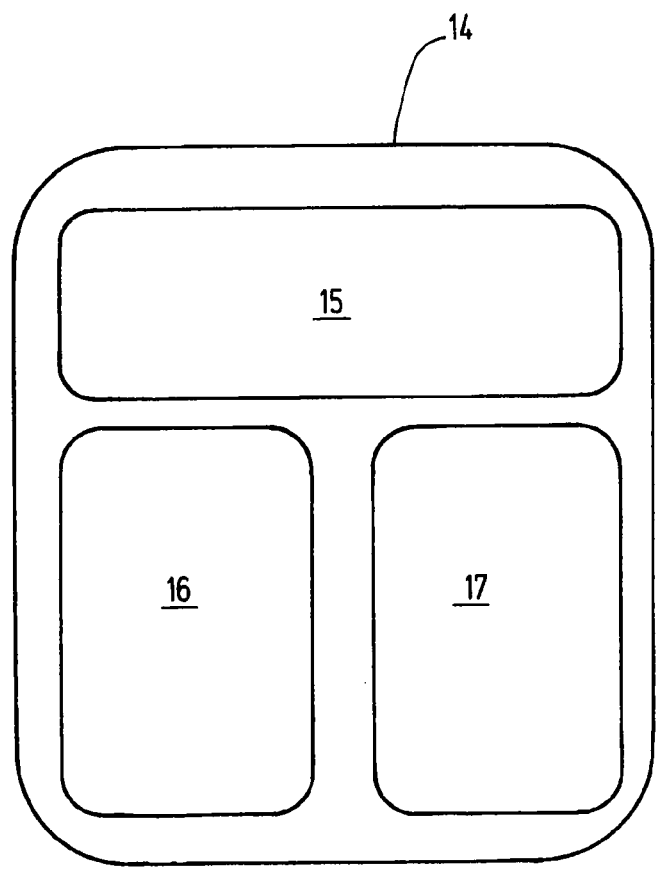
Figure 4:
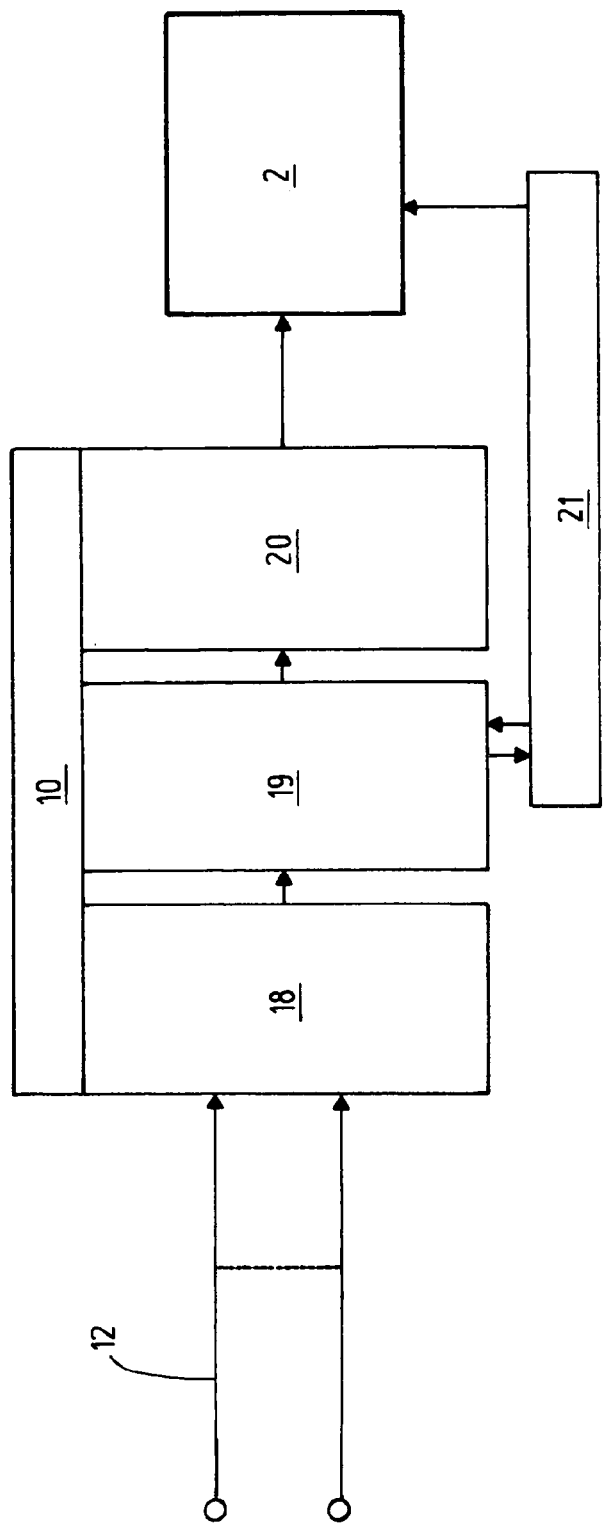
Figure 5:
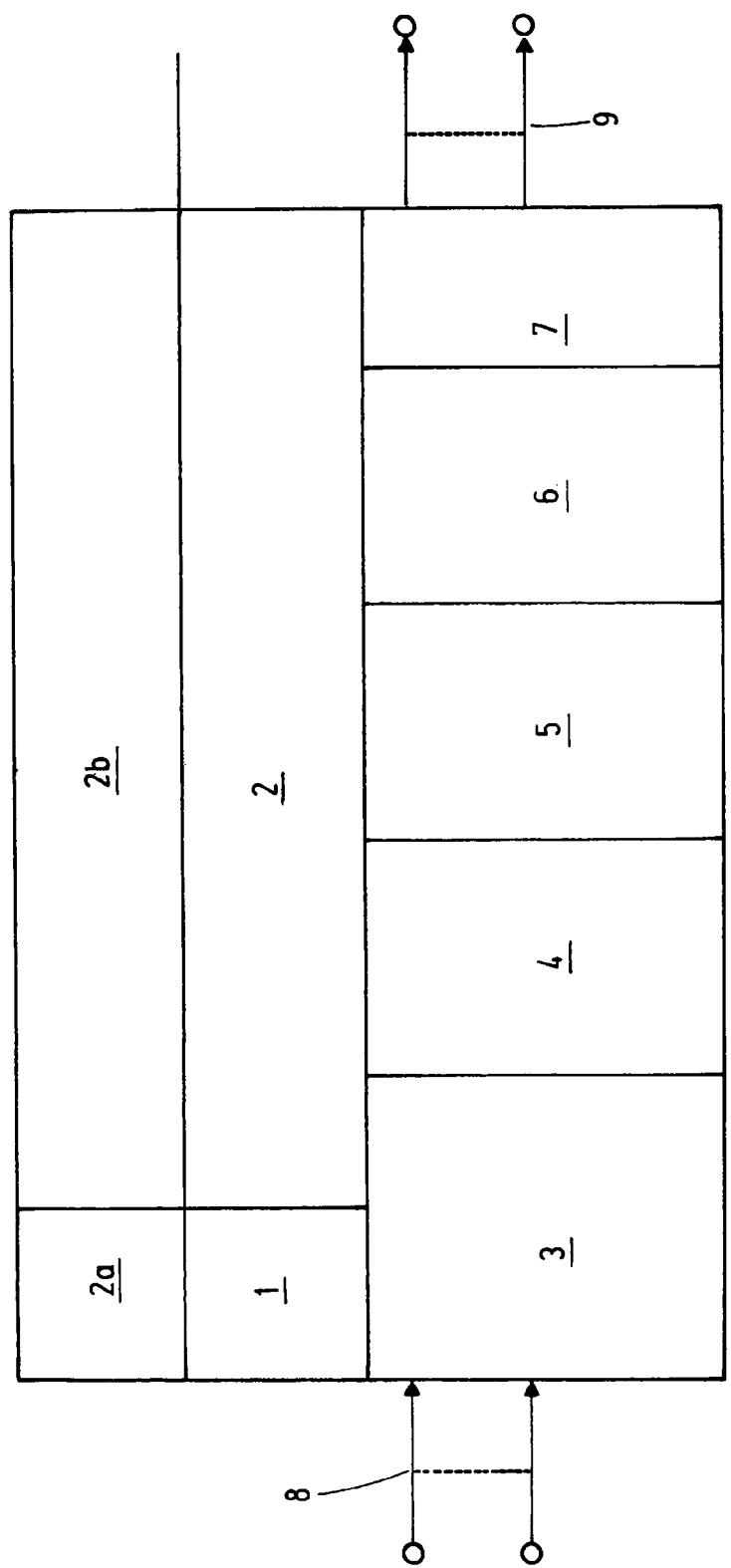
Figure 10:
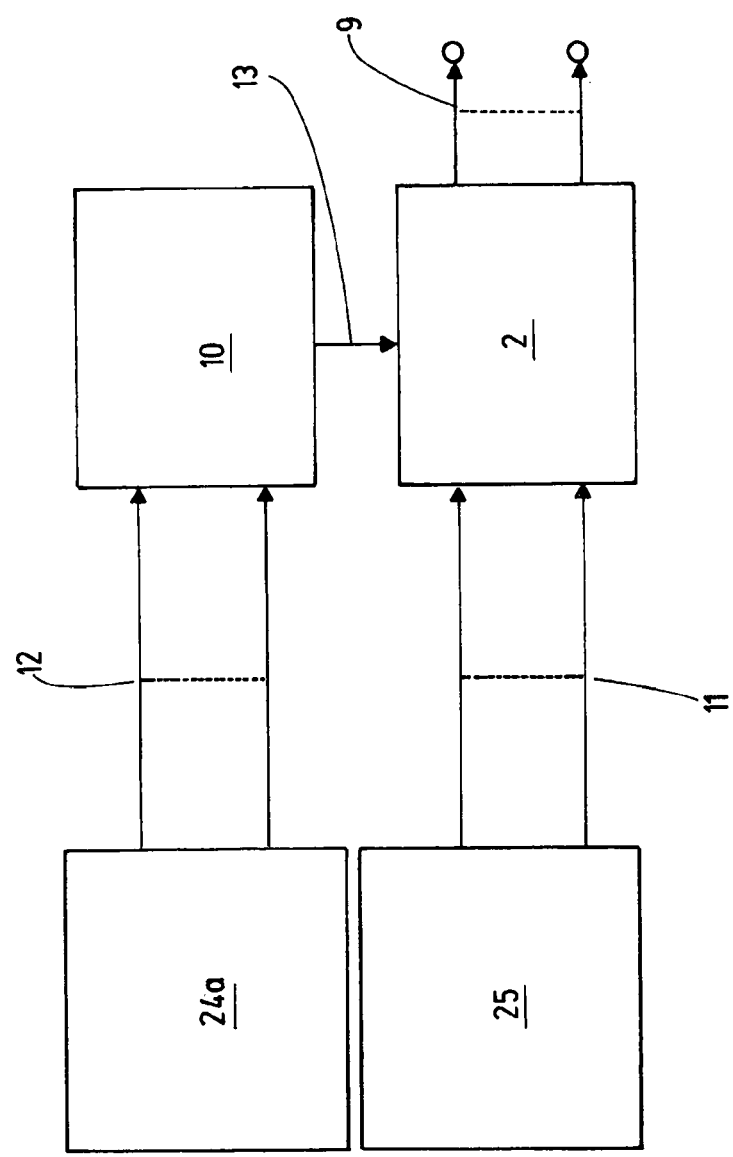
Figure 11:
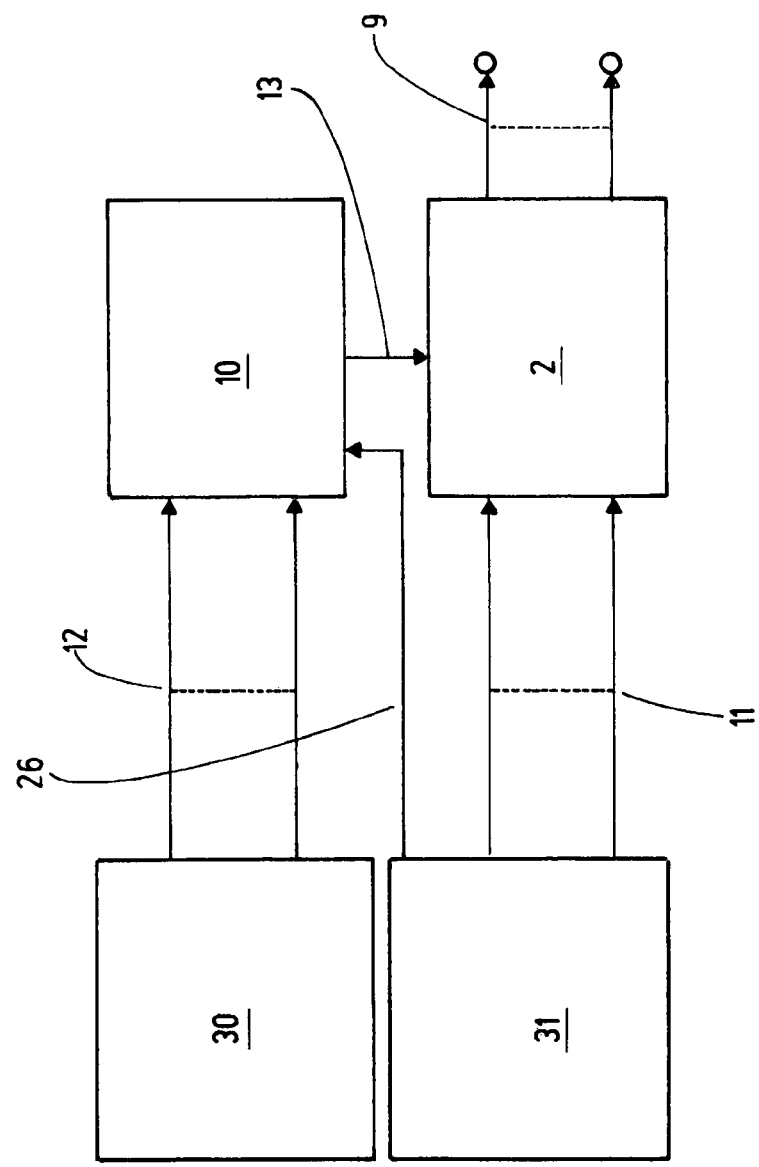
Figure 12:
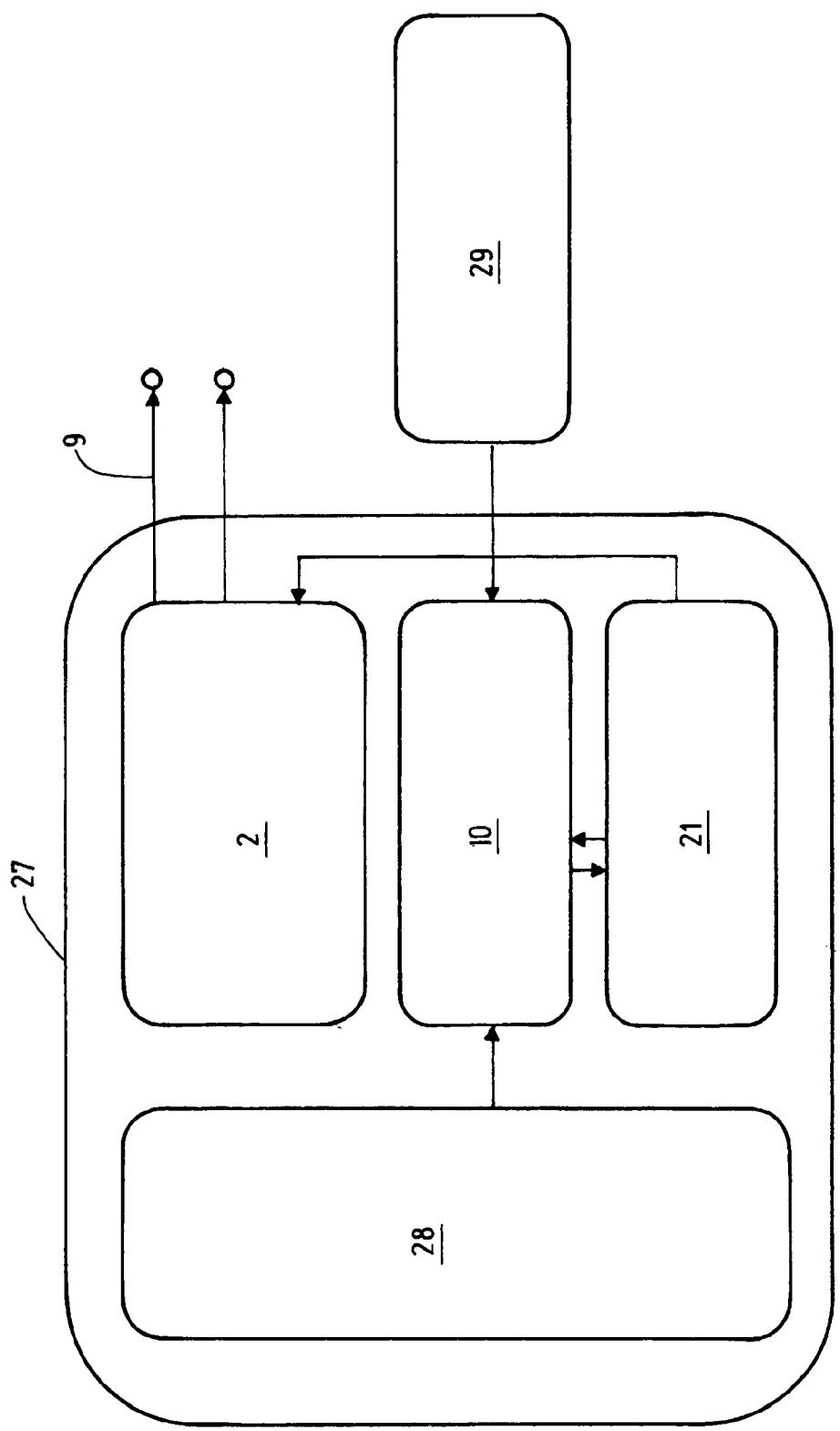

In the following, the invention will be explained in greater detail using the drawings. These show, in a schematic representation:

FIG. 1 a block schematic with multiple effect devices as a unit;

FIG. 2 the method according to the invention, shown in a block schematic;

FIG. 3 the components of a container format according to the invention, in a block schematic;

FIG. 4 the flow chart in a control module according to the invention, additionally shown in a block schematic;

FIG. 5 an expanded unit of effect devices, in a block schematic;

FIGS. 6 to 11 further embodiments of the invention, shown in a block schematic, and FIG. 12 the components of a computer program in the form of a media player according to the invention, in a block schematic.

FIG. 1, in a block schematic, shows a number of effect devices 1, 2, 3, 4, 5, 6, 7, which are connected with one another and together have an audio input 8 and an audio output 9. These effect devices are used to modify the audio signal of an audio file, not shown in FIG. 1.

The effect devices 1, 2, 3, 4, 5, 6, 7 are a "bypass" for activation/deactivation of the entire unit, an "equalizer" for adjusting different frequency bands, a "speech enhancer" for enhancing voices, for example in movies, a "bass level raiser" for raising or lowering freely adjustable bass and level frequencies, a "leveler" for automatic adaptation of the volume level over time, a "stereo spread" for expansion of the sound pattern, and "limiters" for intercepting peak levels at the end of the signal chain, so that no overmodulation can occur.

FIG. 2 shows the method according to the invention, in which meta data that are stored in an audio file, not shown in FIG. 2, are conducted to the control module 10, which has a microcontroller, by way of at least one data line 12. Furthermore, audio signals of the audio file, which file is stored in a storage medium not shown in FIG. 2, get to an effect device 2, which is present in the form of an equalizer in the embodiment of the invention shown in FIG. 2, by way of a line 11. Instead of the individual effect device 2, a combination of effect devices, as shown in FIG. 1, can also be used. The audio signal processed by the effect device 2 gets to the audio output 9. Both audio data and meta data, i.e. data with accompanying information regarding the audio event that is currently being actively played, are processed in the control module 10. The control module 10 associates specific settings of the effect device 2 with specific meta data, by way of the control line 13, and activates them as soon as the audio event starts to play, because the meta data processed by the control module 10 are situated at the start of the audio file or are loaded up from an external meta database, not shown in FIG. 2, which database is linked with the audio file currently being played. Meta data are content-describing data relating to media files, such as audio files and video files. They are used to describe the content of these files (e.g. composer, length, genre) or also to describe subsumptions of different file formats into what are called container formats.

FIG. 3 shows a container format AVI (Audio Video Interleave) that is provided with the reference symbol 14. Here, the meta data, as "header data" 15, describe the synchronized combination of a video file 16 with an audio file 17. The consumer or user activates only the superordinate AVI file, which carries video and audio jointly in its container. In this way, it becomes possible to combine video and audio into a jointly controlled file, without complications.

The control module 10, as also illustrated in FIG. 4, associates meta data with specific previously established settings of the effect device 2, which are stored in a storage medium, in a file 21, under designations identical to meta data, and can be called up. For this purpose, the control module 10 converts meta data to control data for the effect device 2, from a freely configurable number and type of meta data that get into the control module 10 by way of at least one data line 12. In the first functional section 18, the control module 10 recognizes the combination of letters, numbers, and symbols of the meta data currently being read in. After recognition of the received meta data, these are compared with the data sets situated in the file 21 and associated with the functional section 19. Combinations of letters, numbers, and symbols are stored in the file 21; these combinations are directly linked with pre-settings of the effect device 2. If the combination of letters, numbers, and symbols of a meta file is identical with the designation of a data set contained in the file 21 for controlling the effect device 2, the effect device 2 is activated by the functional section 20 of the control module 10, and read out. The control module 10 sends a command to load the associated data set to the effect device 2. After this loading procedure, the effect device 2 has activated its setting, which had been stored under the specifically recognized and activated combination of letters, numbers, and symbols, and changed them accordingly. The more meta data can be recognized, read out, and activated by the control module 10, the greater the repertoire of the individual and automatically triggered sound adaptations with reference to concrete sound events. If no meta data of a media file are recognized, the control module 10 automatically activates an established basic setting, so that no failures of the controller can occur.

The audio data present in a media file or audio file, such as, for example, LPCM (Linear Pulse Code Modulation), in the case of the audio format AIFF (Audio Interchange File Format), are directly supplied to the effect device 2 and processed there. The sound-modulated audio is applied to the audio output of the effect device 2 and is passed on to further processing.

The effect device 2 can also have a freely configurable number and type of sound modules, all of which can be pre-configured by way of manual or automatic pre-settings. These pre-set adjustments, which are stored under individual combinations of letters, numbers, and symbols, are then activated by way of the control module 10, so that the effect device 2 loads the activated pre-setting and modulates the sound in accordance with the activated pre-setting. Aside from the parameters that can be automatically activated, the connected effect device, as is evident from FIG. 5, can also contain what are called master sound modules, which adapt the entire sound system over all the sound modules that can be activated. By means of this master parameter, which is composed of the additional equalizer 2a and the intensity, it becomes possible to adapt the overall sound system to special conditions, such as listening via headphones in contrast to listening in a car. By means of this combination of automatically and manually adjustable parameters, the method according to the invention can be easily adapted and thereby used in maximally flexible manner.

Figure 6:
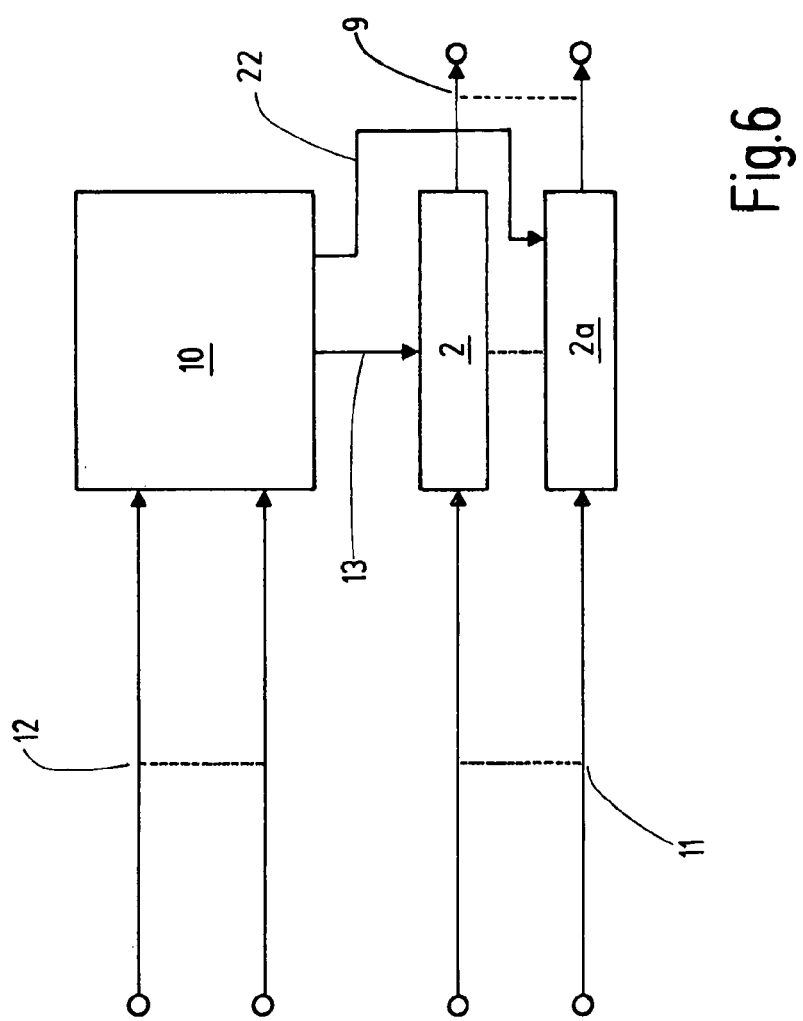
Figure 7:
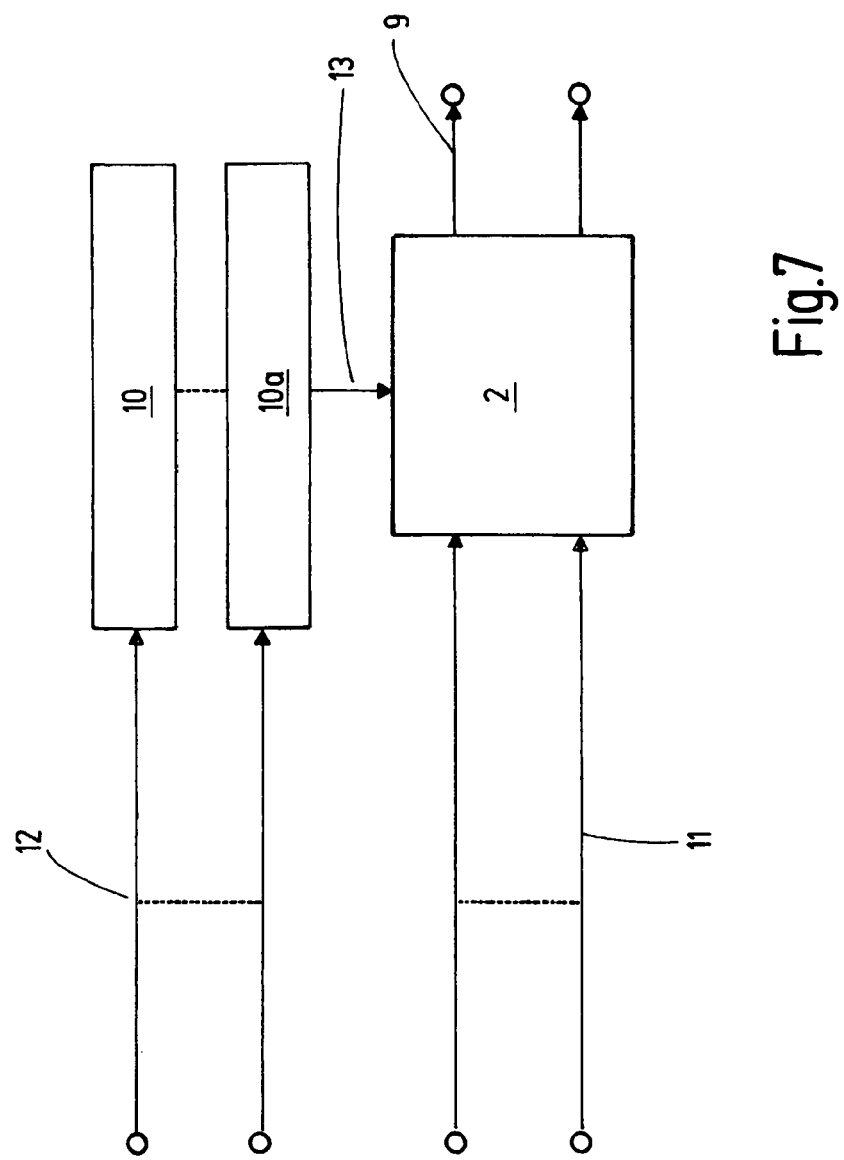
Figure 8:
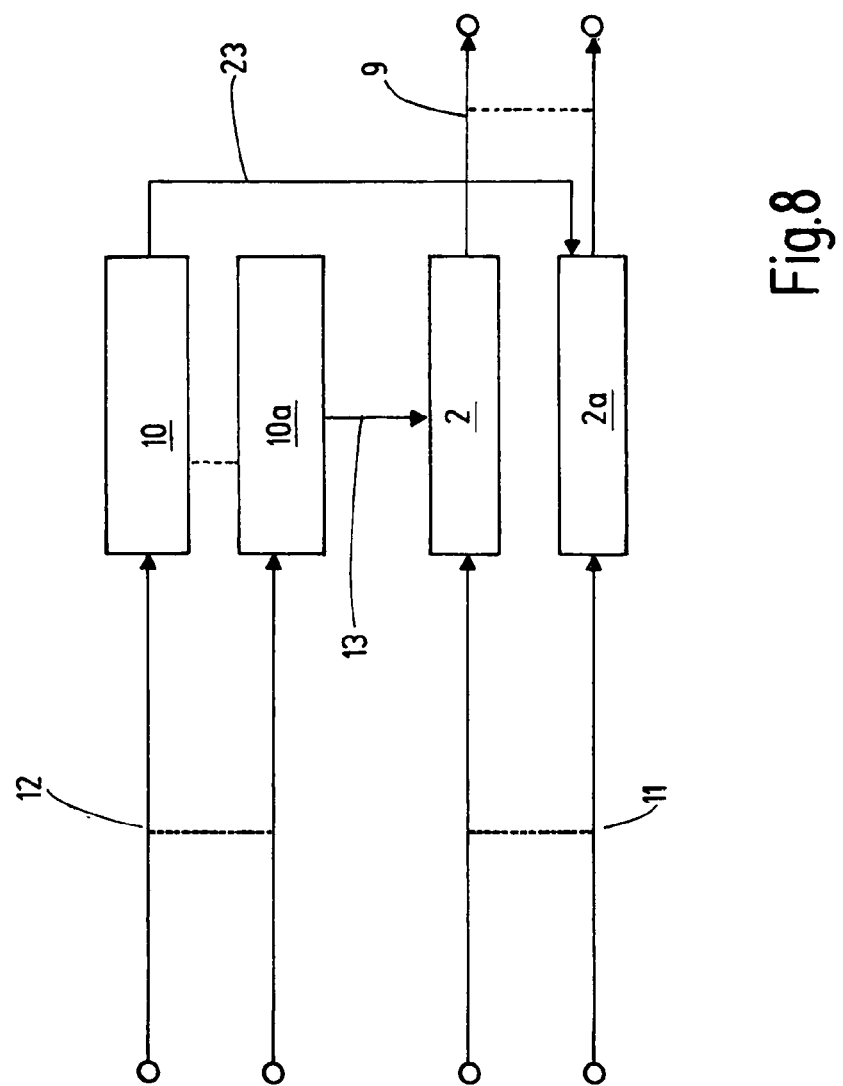
Figure 9:
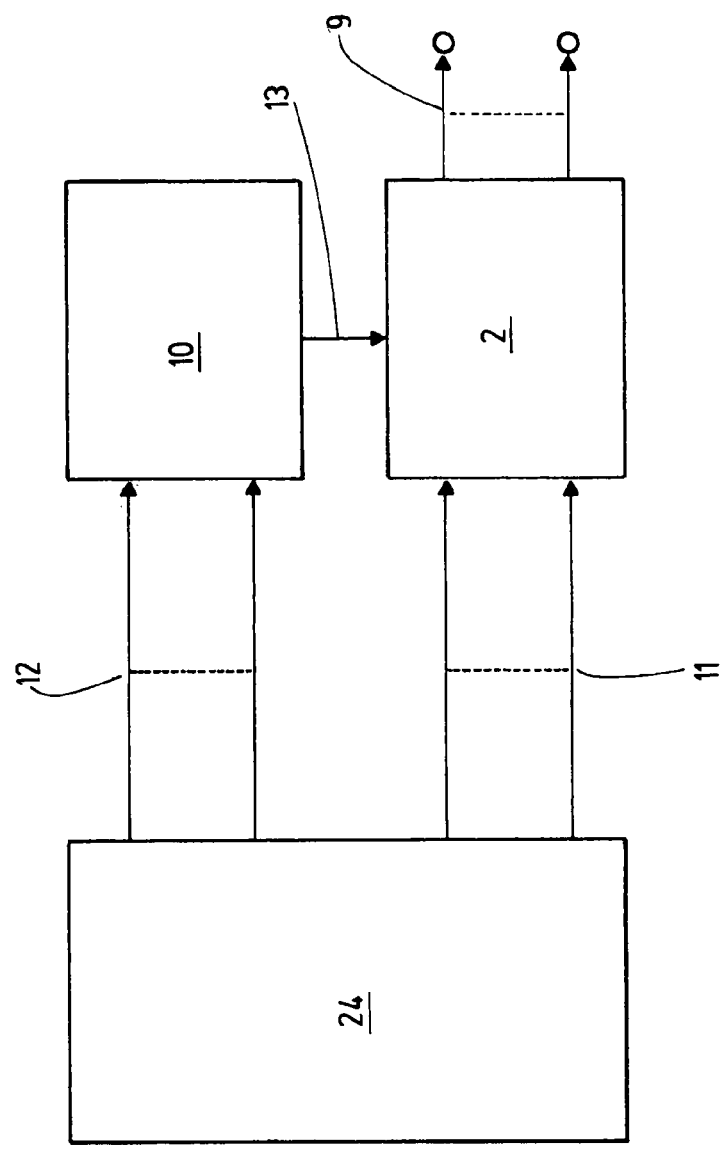

As is evident from the embodiments of the invention according to FIGS. 6 to 11, it is also provided, within the scope of the invention, that the control module 10 controls a non-fixed number of effect devices 2, 2a (via line 22), which are associated with a non-fixed number of audio data sources, on the basis of a non-fixed number of meta data sources (FIG. 6). Furthermore, in a further embodiment of the invention, a non-fixed number of control modules 10, 10a controls an effect device 2 having a non-fixed number of audio data sources, specifically on the basis of a non-fixed number of meta data sources (FIG. 7). As the further embodiments of the invention show, a non-fixed number of control modules 10, 10a controls effect devices 2, 2a (via line 23) having a non-fixed number of audio data sources, on the basis of a non-fixed number of meta data sources (FIG. 8). Alternatively, the meta data source 24 of the control module 10 is a media file, in this regard, with integrated meta data (FIG. 9). As a further variant, the meta data source of the control module 10 is a media-external file, i.e. separate from the media file 25 (audio file) (FIG. 10). Finally, the meta data sources of the control module 10 are an external file 30 and the audio file 31. In this regard, the meta data from the audio file 31 are supplied to the control module 10 by way of the line 26 (FIG. 11).

FIG. 12 shows a computer program 27. If an audio file or audio/video file is activated in the playlist 28, the control module 10 recognizes the meta data of the media file activated in the playlist 28 or/and the meta data of external meta databases 29 that belong to the media file. After recognition, the control module 10 compares the found meta data with the data sets contained in the file 21. If the control module 10 is able to associate a control data set contained in the file 21 or/and an external meta database 29 with the media file activated in the playlist 28, it sends the control command contained in the file to the effect device, which changes in accordance with the control data contained in the control file. Finally, the audio outputs 9 of the effect device 2 are conducted to the outside from the media player that is present as the present computer program 27, so that they can be connected or processed further with amplifiers/loudspeakers.

REFERENCE SYMBOL LIST 1 effect device
2 effect device
2a equalizer
3 effect device
4 effect device
5 effect device
6 effect device
7 effect device
8 audio input
9 audio output
10 control module
10a control module
11 line
12 data line
13 control line
14 container format
15 header data
16 video data
17 audio file
18 function section
19 function section
20 function section
21 file
22 data line
23 data line
24 meta data source
25 media file
26 line
27 computer program
28 playlist 29 meta database
30 external file
31 audio file

The invention claimed is:

1. A method for improvement of the sound quality of an audio file in an audio device by modification of an audio signal by means of at least one effect device, each effect device comprising a freely configurable number and type of sound modules, the method comprising:
 a) association of the audio file with a freely configurable number and type of meta data which are stored in meta files, wherein the audio signal of the audio file is outputtable as a plurality of audio events played one after the other,
 b) comparison of the meta data in the meta files associated with the audio file with data sets in a setting file in which settings of the freely configurable number and type of sound modules of the at least one effect device are stored,
 c) selection of a data set of the setting file designated by a combination of letters, numbers, and symbols in the meta data in the meta files,
 d) loading of the selected data set of the setting file into the at least one effect device to automatically trigger individual sound adaptations dependent on specific audio events,
 e) outputting the audio signal,
 f) activation of the at least one effect device while outputting the audio signal, wherein the at least one effect device is set with values from the loaded selected data set of the setting file to produce the individual sound adaptations dependent on the specific audio events within the plurality of audio events of the audio signal of the audio file,
 wherein the meta files are stored in an external database that comprises meta files supplied by one or more metadata vendors.

2. The method according to claim 1, wherein a control module of the audio device controls the method steps b) to d).

3. The method according to claim 1, wherein the setting files from method step b) are stored in a database of the audio device or in a Cloud.

4. The method according to claim 1, wherein the audio signal modified by the at least one effect device is passed on to audio outputs of the audio device.

5. The method according to claim 1, wherein the external database comprises at least two databases.

6. A device for improving a sound quality of an audio file in an audio device, comprising:
 a first storage medium in which audio files are stored, with which meta files having meta data are associated and/or are associable, wherein an audio signal of one of the audio files is outputtable as a plurality of audio events played one after the other,
 at least one effect device comprising a freely configurable number and type of sound modules,
 a further storage medium in which a setting file is stored, said setting file containing data sets defining settings of the freely configurable number and type of sound modules of the at least one effect device,
 a control module that is associated with the first storage medium, the at least one effect device, and the further storage medium, and
 an external database that stores the meta files,
 wherein the control module is configured to
  select a data set of the setting file designated by a combination of letters, numbers, and symbols in the meta data in the metal files;
  load the selected data set of the setting file into the at least one effect device to automatically trigger individual sound adaptations dependent on specific audio events,
  activate the at least one effect device while playing the audio signal, wherein the at least one effect device is set with values from the loaded selected data set of the setting file to produce the individual sound adaptations dependent on the specific audio events within the plurality of audio events of the audio signal of the audio file.

7. The device according to claim 6, wherein the device has audio outputs.

8. The device according to claim 6, wherein the device has audio inputs.

9. The device according to claim 6, wherein the device has video inputs and/or video outputs.

10. The device according to claim 6, wherein the at least one effect device is more than one, wherein the control module controls a non-fixed number of the more than one effect devices, and wherein the more than one effect devices are associated with a non-fixed number of audio data sources, on the basis of a non-fixed number of meta data sources,
 wherein the non-fixed numbers of audio data sources is greater than zero, and
 wherein the non-fixed number of meta data sources is greater than zero.

11. The device according to claim 6, further comprising one or more additional control modules, each of the control modules controlling the at least one effect device.

12. A computer program stored in a non-transitory computer readable medium, wherein the computer program contains an algorithm that is processed by a processor, wherein the algorithm processes a method for improvement of the sound quality of an audio file in an audio device by modification of the audio signal by at least one effect device, the method comprising:
 a) association of the audio file with a freely configurable number and type of meta data which are stored in meta files, wherein the audio signal of the audio file is outputtable as a plurality of audio events played one after the other,
 b) comparison of the meta data in the meta files associated with the audio file with data sets in a setting file in which settings of the freely configurable number and type of sound modules of the at least one effect device are stored,
 c) selection of a data set of the setting file designated by a combination of letters, numbers, and symbols in the meta data in the meta files,
 d) loading of the selected data set of the setting file into the at least one effect device to automatically trigger individual sound adaptations dependent on specific audio events, and
 e) activation of the at least one effect device while outputting the audio signal, wherein the at least one effect device is set with values from the loaded selected data set of the setting file to produce the individual sound adaptations dependent on the specific audio events within the plurality of audio events of the audio signal of the audio file.

13. The computer program according to claim 12, wherein the computer program is present in the form of a media player.

* * * * *